(12) United States Patent
Fan et al.

(10) Patent No.: US 7,595,225 B1
(45) Date of Patent: Sep. 29, 2009

(54) LEADLESS PLASTIC CHIP CARRIER WITH CONTACT STANDOFF

(76) Inventors: Chun Ho Fan, Flat E, 27/F, Block 3, Lido Garden, Sam Tseng (HK); Kin Pul Kwan, Flat E, 9/F, Block 1, High Land Park, Lai King (HK); Hoi Chi Wong, Room 3508, Ching On House, Tsz Ching Estate (HK); Neil McLellan, 110 Woodranch Cir., Danville, CA (US) 94506

( * ) Notice: Subject to any disclaimer, the term of this patent is extended or adjusted under 35 U.S.C. 154(b) by 0 days.

(21) Appl. No.: 10/957,576

(22) Filed: Oct. 5, 2004

(51) Int. Cl.
*H01L 21/00* (2006.01)

(52) U.S. Cl. .............. 438/112; 438/111; 257/E21.502

(58) Field of Classification Search ............ 438/110, 438/111, 112, 126, 127; 257/E21.502, E23.124
See application file for complete search history.

(56) References Cited

U.S. PATENT DOCUMENTS

| | | | |
|---|---|---|---|
| 4,530,152 A | 7/1985 | Roche et al. |
| 4,685,998 A | 8/1987 | Quinn et al. |
| 4,812,896 A | 3/1989 | Rothgery et al. |
| 5,066,831 A | 11/1991 | Spielberger et al. |
| 5,157,480 A | 10/1992 | McShane et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,221,642 A | 6/1993 | Burns |
| 5,273,938 A | 12/1993 | Lin et al. |
| 5,277,972 A | 1/1994 | Sakumoto et al. |
| 5,279,029 A | 1/1994 | Burns |
| 5,293,072 A | 3/1994 | Tsuji et al. |
| 5,332,864 A | 7/1994 | Liang et al. |
| 5,343,076 A | 8/1994 | Katayama et al. |
| 5,406,124 A | 4/1995 | Morita et al. |
| 5,424,576 A | 6/1995 | Djennas et al. |

(Continued)

FOREIGN PATENT DOCUMENTS

JP 59-208756 11/1984

OTHER PUBLICATIONS

"Depression." Roget's New Millennium™ Thesaurus, First Edition (v 1.3.1). Lexico Publishing Group, LLC. Jan. 2, 2008. <Thesaurus.com http://thesaurus.reference.com/browse/depression>.*

*Primary Examiner*—Michelle Estrada
*Assistant Examiner*—Jarrett J Stark

(57) ABSTRACT

A process for fabricating a leadless plastic chip carrier. A first surface of a leadframe strip is selectively etched to thereby provide depressions in the first surface and metal contacts are deposited in the depressions in the first surface of the leadframe strip. At least one layer of metal is selectively plated on at least the metal contacts to provide a plurality of selectively plated contact pads and a die attach pad. A semiconductor die is mounted on the first surface of the die attach pad and the semiconductor die is wire bonded to ones of the contact pads. The wire bonds and the semiconductor die are encapsulated in a molding material such that the molding material covers the die attach pad and the contact pads. The leadframe strip is etched away thereby exposing the metal contacts in the form of an array and the leadless plastic chip carrier is singulated from other leadless plastic chip carriers.

16 Claims, 4 Drawing Sheets

U.S. PATENT DOCUMENTS

| | | |
|---|---|---|
| 5,444,301 A | 8/1995 | Song et al. |
| 5,457,340 A | 10/1995 | Templeton, Jr. et al. |
| 5,474,958 A | 12/1995 | Djennas et al. |
| 5,483,099 A | 1/1996 | Natarajan et al. |
| 5,604,376 A | 2/1997 | Hamburgen et al. |
| 5,608,267 A | 3/1997 | Mahulikar et al. |
| 5,639,990 A | 6/1997 | Nishihara et al. |
| 5,640,047 A | 6/1997 | Nakashima |
| 5,641,997 A | 6/1997 | Ohta et al. |
| 5,646,831 A | 7/1997 | Manteghi |
| 5,650,663 A | 7/1997 | Parthasarathi |
| 5,683,806 A | 11/1997 | Sakumoto et al. |
| 5,696,666 A | 12/1997 | Miles et al. |
| 5,701,034 A | 12/1997 | Marrs |
| 5,710,064 A | 1/1998 | Song et al. |
| 5,710,695 A | 1/1998 | Manteghi |
| 5,777,382 A | 7/1998 | Abbott et al. |
| 5,894,108 A | 4/1999 | Mostafazadeh et al. |
| 5,976,912 A | 11/1999 | Fukutomi et al. |
| 6,001,671 A * | 12/1999 | Fjelstad ..................... 438/112 |
| 6,057,601 A | 5/2000 | Lau et al. |
| 6,124,637 A | 9/2000 | Freyman et al. |
| 6,194,786 B1 | 2/2001 | Orcutt |
| 6,229,200 B1 | 5/2001 | McLellan et al. |
| 6,294,830 B1 | 9/2001 | Fjelstad |
| 6,306,685 B1 | 10/2001 | Liu et al. |
| 6,459,163 B1 | 10/2002 | Bai |
| 6,489,557 B2 | 12/2002 | Eskildsen et al. |
| 6,498,099 B1 | 12/2002 | McLellan et al. |
| 6,528,877 B2 * | 3/2003 | Ernst et al. .................. 257/707 |
| 6,585,905 B1 | 7/2003 | Fan et al. |
| 6,635,957 B2 * | 10/2003 | Kwan et al. .................. 257/691 |
| 6,762,118 B2 | 7/2004 | Liu et al. |
| 6,872,661 B1 * | 3/2005 | Kwan et al. .................. 438/689 |
| 6,989,294 B1 * | 1/2006 | McLellan et al. ............ 438/111 |
| 2002/0000671 A1 * | 1/2002 | Zuniga et al. ................ 257/773 |
| 2003/0015780 A1 * | 1/2003 | Kang et al. .................. 257/684 |

* cited by examiner

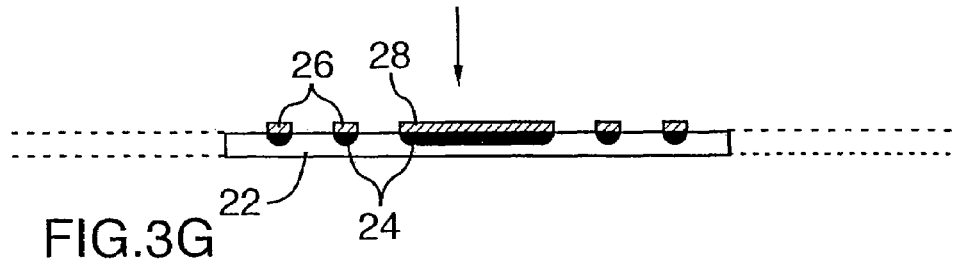
FIG.3G
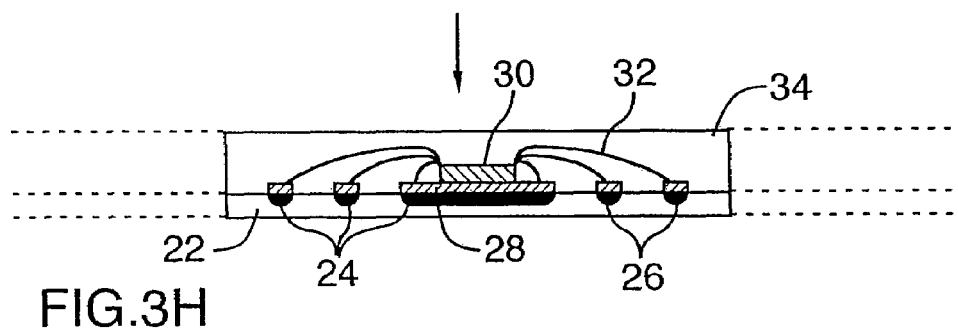
FIG.3H
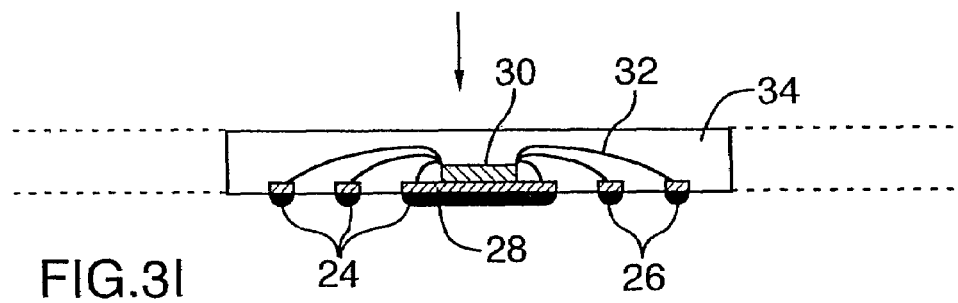
FIG.3I
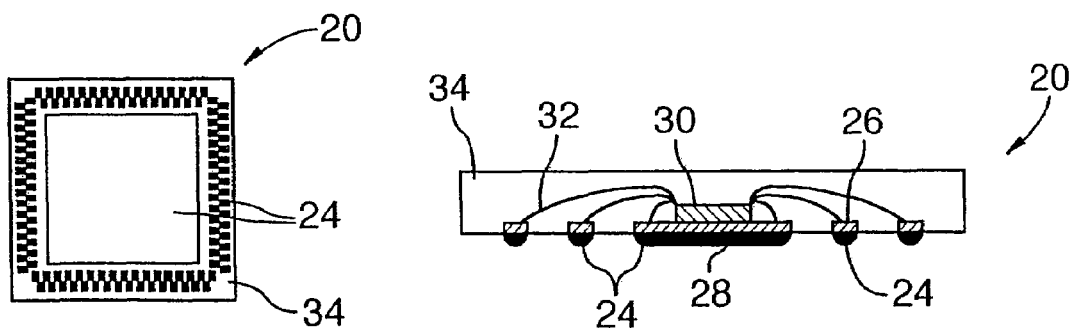
FIG. 4
FIG.3J

US 7,595,225 B1

LEADLESS PLASTIC CHIP CARRIER WITH CONTACT STANDOFF

FIELD OF THE INVENTION

The present invention relates in general to integrated circuit packaging and more particularly to an improved leadless plastic chip carrier including solder bump standoff at the contact pads and die attach pad locations.

BACKGROUND OF THE INVENTION

According to well known prior art IC (integrated circuit) packaging methodologies, semiconductor dice are singulated and mounted using epoxy or other conventional means onto respective die pads (attach paddles) of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a mother board, thereby limiting the packaging density of such prior art devices.

In order to overcome these and other disadvantages of the prior art, the Applicants previously developed a Leadless Plastic Chip Carrier (LPCC). According to Applicants' LPCC methodology, a leadframe strip is provided for supporting up to several hundred devices. Singulated IC dice are placed on the strip die attach pads using conventional die mount and epoxy techniques. After curing of the epoxy, the dice are gold wire bonded to peripheral internal leads. The leadframe strip is then molded in plastic or resin using a modified mold wherein the bottom cavity is a flat plate. In the resulting molded package, the die pad and leadframe inner leads are exposed. By exposing the bottom of the die attach pad, mold delamination at the bottom of the die attach pad (paddle) is eliminated, thereby increasing the moisture sensitivity performance. Also, thermal performance of the IC package is improved by providing a direct thermal path from the exposed die attach pad to the motherboard. By exposing the leadframe inner leads, the requirement for mold locking features of outer leads is eliminated and no outer leads are necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing package design flexibility over prior art packages (i.e. custom trim tools and form tools are not required). These and several other advantages of Applicants' own prior art LPCC process are discussed in Applicants' U.S. Pat. No. 6,229,200, issued May 8, 2001, the contents of which are incorporated herein by reference.

According to Applicants' U.S. Pat. No. 6,498,099, the contents of which are incorporated herein by reference, a localized etch process is provided for the improved manufacture of the LPCC IC package. The leadframe strip is subjected to a partial etch on one or both of the top and bottom surfaces in order to create a pattern of contact leads (pads) and a die attach pad (paddle). This method of manufacture provides many advantages including standoff at the contact pads.

While these processes yield IC package designs with improved performance, further IC package improvements are still desirable and are driven by industry demands for increased thermal and electrical performance and decreased size and cost of manufacture.

SUMMARY OF THE INVENTION

According to an aspect of the present invention, there is provided a process for fabricating a leadless plastic chip carrier. A first surface of a leadframe strip is selectively etched to thereby provide depressions in the first surface and metal contacts are deposited in the depressions in the first surface of the leadframe strip. At least one layer of metal is selectively plated on at least the metal contacts to provide a plurality of selectively plated contact pads and a die attach pad. A semiconductor die is mounted on the first surface of the die attach pad and the semiconductor die is wire bonded to ones of the contact pads. The wire bonds and the semiconductor die are encapsulated in a molding material such that the molding material covers the die attach pad and the contact pads. The leadframe strip is etched away thereby exposing the metal contacts in the form of an array and the leadless plastic chip carrier is singulated from other leadless plastic chip carriers.

Advantageously, the process provides solder bump standoff at the contact pads and die attach pad locations. This facilitates solder mounting to the printed circuit board (PCB), allowing for better solder assembly to a PCB and reduced stresses at the PCB. This is accomplished while maintaining improved package density, thermal performance and electrical performance over traditional QFP packages. Also, the solder bump standoff eases rework of packages that are soldered to a PCB.

After etching away the remainder of the leadframe strip, the contact pads and the die attach pads of each of the units of the leadframe strip are electrically isolated. However, the molding material holds the strip together in a single piece, thereby permitting electrical functional testing for each device while still in a strip.

BRIEF DESCRIPTION OF THE DRAWINGS

The invention will be better understood with reference to the drawings and the following description, in which:

FIGS. 3A-3J show processing steps for manufacturing a leadless plastic chip carrier according to another embodiment of the present invention; and FIG. 4 shows an elevation view of the leadless plastic chip carrier manufactured according to the embodiment of FIGS. 3A-3J.

DETAILED DESCRIPTION OF THE PREFERRED EMBODIMENTS

Figure 1A:
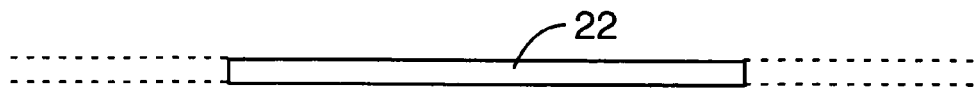
FIGS. 1A-1J show processing steps for manufacturing a leadless plastic chip carrier according to an embodiment of the present invention.

Reference is made to FIGS. 1A to 1J and FIG. 2 to describe a process for fabricating a leadless plastic chip carrier (LPCC) according to an embodiment of the present invention. The LPCC is best shown in the sectional side view of FIG. 1J and is indicated generally by the numeral 20. In fabricating the LPCC 20, a first surface of a leadframe strip 22 is selectively etched to thereby provide depressions in the first surface, and metal contacts 24 are deposited in the depressions in the first surface of the leadframe strip 22. At least one layer of metal is selectively plated on at least the metal contacts to provide a plurality of selectively plated contact pads 26 and a die attach pad 28. A semiconductor die 30 is mounted on the first surface of the die attach pad 28 and the semiconductor die 30 is wire bonded to ones of the contact pads 26. The wire bonds 32 and the semiconductor die 30 are encapsulated in a molding material 34 such that the molding material 34 covers the die attach pad 28 and the contact pads 26. The leadframe strip 22 is etched away thereby exposing the metal contacts 24 in the form of an array and the leadless plastic chip carrier 20 is singulated from other leadless plastic chip carriers.

The process for fabricating the LPCC 20 will now be described with particular reference to FIGS. 1A to 1J. For ease of illustration, reference is made to a single LPCC package throughout the description. It will be understood however, that the LPCC 20 is gang fabricated and then singulated by sawing or punching.

FIG. 1A shows a sectional side view of a Cu (copper) panel substrate which forms the raw material of the leadframe strip 22. As discussed in detail in Applicant's U.S. Pat. No. 6,299,200, the leadframe strip 22 is divided into a plurality of sections, each of which incorporates a plurality of leadframe units in an array (e.g. 3×3 array, 5×5 array, etc.). Only one such whole unit is depicted in FIG. 1A, portions of adjacent units being indicated by stippled lines.

Figure 1B:
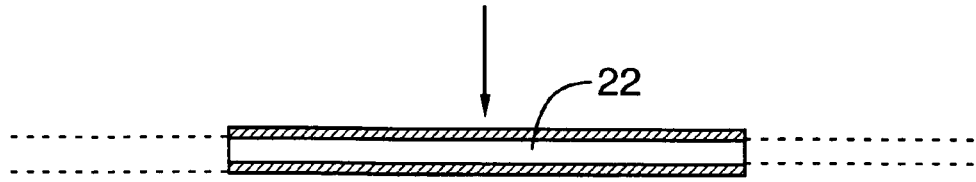
Figure 1C:
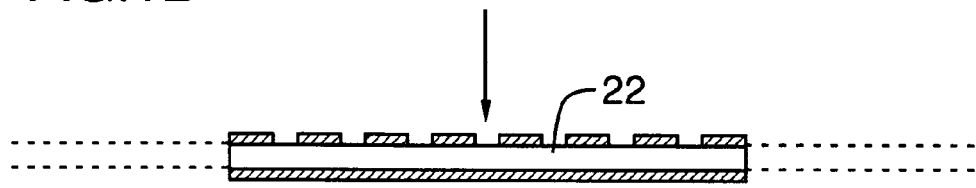

Referring to FIG. 1B, the leadframe strip 22 is coated with a layer of a photo-imagable etch resist such as a photo-imagable epoxy. Both the upper and lower surfaces of the leadframe strip 22 are coated with the photo-imagable etch resist. The photo-imagable etch resist is spin coated on the leadframe strip 22 and imaged by exposure of the etch resist to ultraviolet light masked by a photo-tool. Subsequent developing of the etch resist provides the plating mask shown in FIG. 1C. The etch resist is thereby patterned to provide pits in which the upper surface of the leadframe strip 22 is exposed.

Figure 1D:
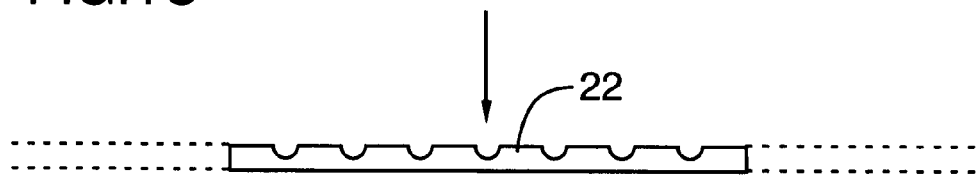

The leadframe strip 22 is then immersion or pressurized spray etched to etch away portions of the leadframe strip 22 that are exposed, to provide pits in the first surface of the leadframe strip 22. The etch resist is then stripped away using conventional means (FIG. 1D). Thus, the leadframe strip 22 is selectively etched using the etch resist mask of FIG. 1C. As shown in FIG. 1D, The depressions are generally curved etched away regions that are created during etching.

Figure 1E:
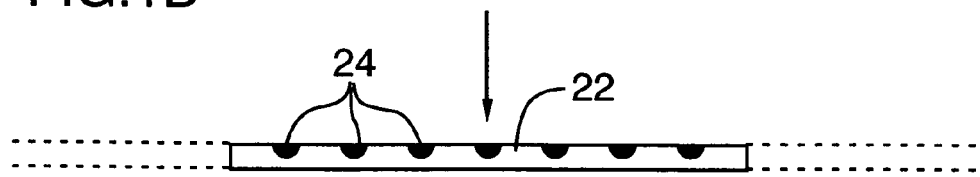

Metal contacts 24 are then deposited in the depressions in the first surface of the leadframe strip 22, to fill the depressions. The metal contacts 24 are solder contacts that are deposited by known solder paste printing technique, followed by reflow using known reflow techniques (FIG. 1E). This provides an array of solder filled depressions in the first surface of the leadframe strip 22. The metal contacts 24 later provide signal and power connections through the contact pads 26, through the wire bonds 32 and to corresponding pads of the semiconductor die 30 in the resulting leadless plastic chip carrier.

Figure 1F:
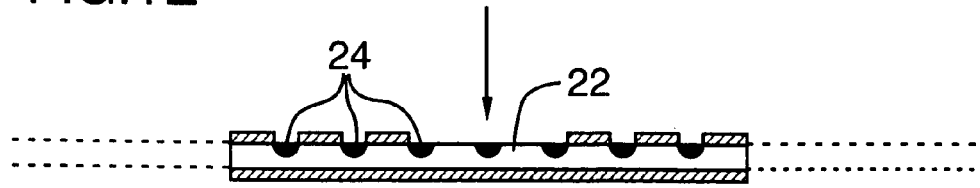

Referring to FIG. 1F, the leadframe strip 22 is coated with a layer of photo-imagable solder mask such as a photo-imagable epoxy. Both the upper and lower surfaces of the leadframe strip 22 are coated with the photo-imagable solder mask and the solder mask is imaged by exposure of the solder mask to ultraviolet light masked by a photo-tool and then developed. The solder mask is thereby patterned to provide pits in which the metal contacts 24 are exposed and a larger central pit in which several metal contacts 24 are exposed. It can be seen that a portion of the leadframe strip 22 between the metal contacts 24, is also exposed in the larger central pit in the solder mask.

Figure 1G:
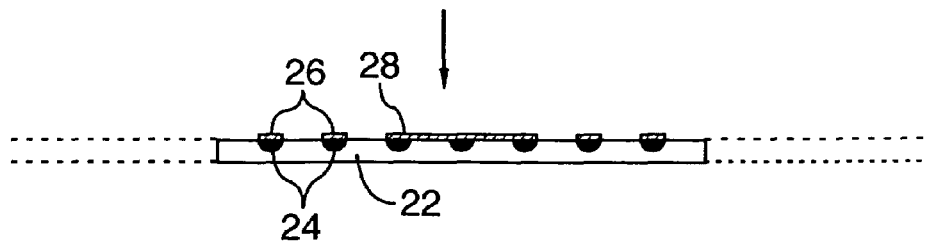

Referring to FIG. 1G, layers of metals are deposited by plating in the pits in the solder mask, on the metal contacts 24 and the exposed portion of the leadframe strip, to form the plurality of contact pads 26 and the die attach pad 28. Different plating options are possible.

In one option, a layer of Au (gold) (for example, 20 microinches) is deposited, followed by layers of Ni (nickel) (for example, 40 microinches), and Cu (3-4 mils). Final layers of Ni (for example, 40 microinches) and Au (for example, 20 microinches) are then deposited.

Other plating options are available. These plating options include, for example, any of the following options:
successive layers of palladium, nickel and gold;
successive layers of palladium and gold;
successive layers of palladium, nickel, palladium and gold;
successive layers of palladium, nickel and silver; and
successive layers of copper nickel and gold.

A metal thickness of between 2 and 40 microinches for each layer is typically suitable. After plating, the photo-imagable solder mask is stripped away.

Figure 1H:
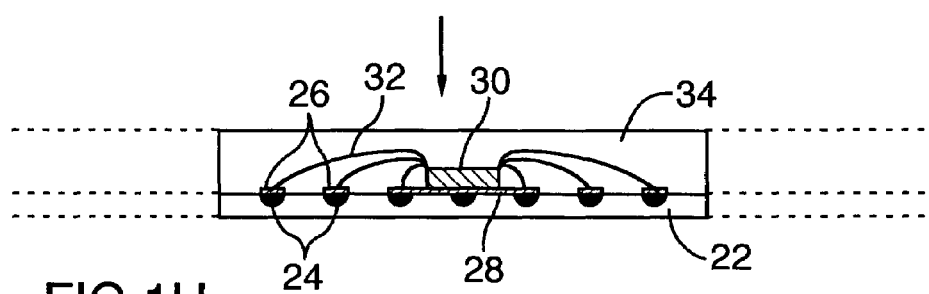

Referring now to FIG. 1H, a singulated semiconductor die 30 is then conventionally mounted via epoxy (or other suitable means) to the die attach pad 28, and the epoxy is cured. Gold wire bonds 32 are then bonded between the semiconductor die 30 and the contact pads 26 and between the semiconductor die 30 and the die attach pad 28. The leadframe strip 22 is then molded in a suitable mold, using a molding material 34 and the molding material 34 is cured, as described in Applicants own U.S. Pat. No. 6,229,200. As shown, the wire bonds 32 and the semiconductor die 30 are thereby encapsulated and the die attach pad 28 and the contact pads 26 are covered by the molding material 34.

Figure 1I:
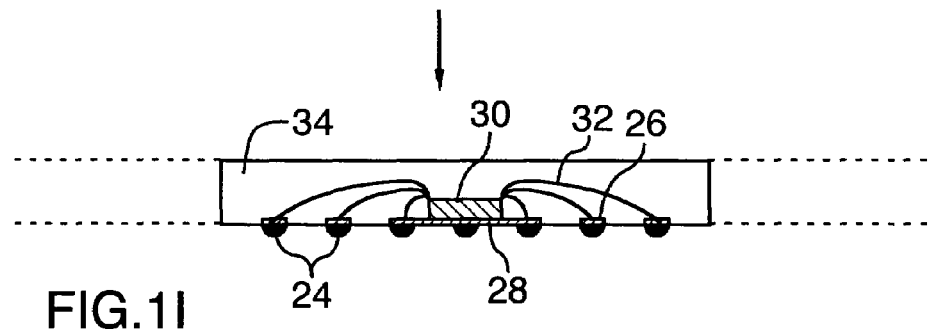
Figure 1J:
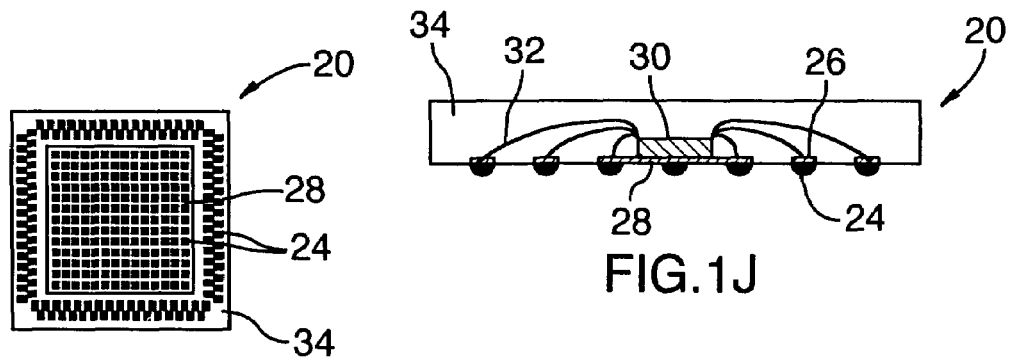

The leadframe strip 22 is then subjected to an alkaline etch via full immersion etching to remove the remainder of the leadframe strip 22 and thereby expose the metal contacts 24 (FIG. 1I). Clearly the metal contacts 24 are located on the contact pads 26 in the form of a grid array of solder bumps. It will be appreciated that the metal contacts 24 that previously were in depressions in the surface of the leadframe strip now protrude from the lower surface of the molding material 34 shown in FIG. 1I, thereby providing contact standoff.

Figure 2:
FIG. 2 shows an elevation view of the leadless plastic chip carrier manufactured according to the embodiment of FIGS. 1A-1J.

The individual packages are joined together by the molding material 34. Since the packages are electrically isolated prior to singulation, testing of the individual packages prior to singulation is possible. Singulation of the individual packages is then performed by, for example, saw singulation (FIG. 1J), An elevation view of the resulting LPCC 20 is shown in FIG. 2.

Reference is now made to FIGS. 3A to 3I to describe a process for fabricating a leadless plastic chip carrier (LPCC) 20 according to another embodiment of the present invention. It will be appreciated that many of the process steps of the present embodiment are similar to those of the first described embodiment.

Figure 3A:
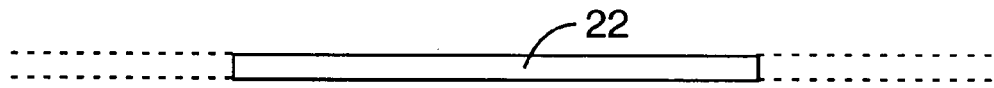

FIG. 3A shows a sectional side view of a Cu (copper) panel substrate which forms the raw material of the leadframe strip 22. Again portions of adjacent units are indicated by stippled lines.

Figure 3B:
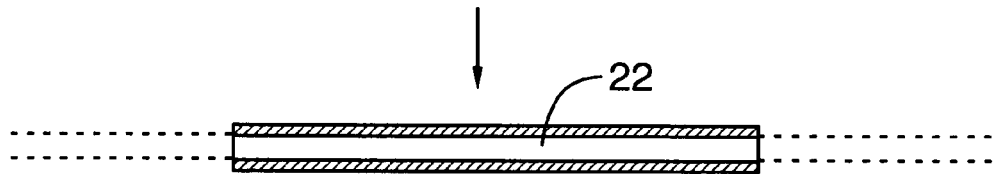
Figure 3C:
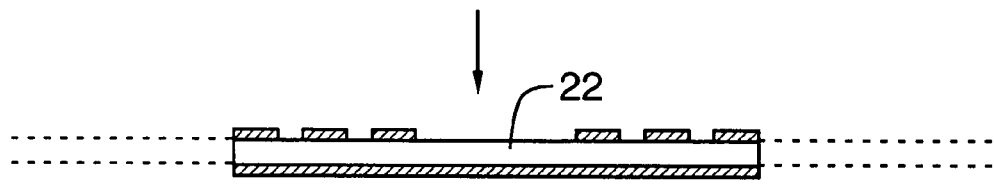

Referring to FIG. 3B, the leadframe strip 22 is coated with a layer of a photo-imagable etch resist such as a photo-imagable epoxy. Both the upper and lower surfaces of the leadframe strip 22 are coated with the photo-imagable etch resist. The photo-imagable etch resist is spin coated on the leadframe strip 22 and imaged by exposure of the etch resist to ultraviolet light masked by a photo-tool. The etch resist is subsequently developed to provide the plating mask shown in FIG. 3C. The etch resist is thereby patterned to provide pits in which the upper surface of the leadframe strip 22 is exposed. As shown, a centrally located pit is larger than the surrounding pits in the present embodiment. It will be appreciated that this centrally located pit is positioned at a location at which the die attach pad 28 is later plated.

Figure 3D:
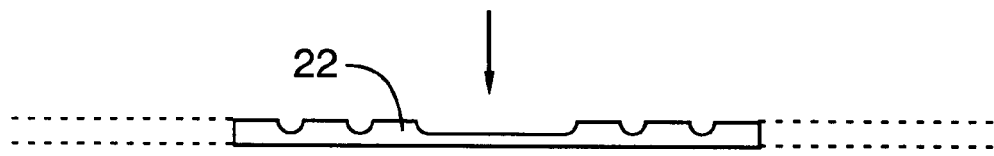

The leadframe strip 22 is then immersion or pressurized spray etched to etch away portions of the leadframe strip 22 that are exposed to provide pits in the first surface of the leadframe strip 22. The etch resist is then stripped away using conventional means (FIG. 3D). Thus, the leadframe strip 22 is selectively etched using the etch resist mask of FIG. 3C. As shown in FIG. 3D. The depressions are generally curved etched away regions that are created during etching. A larger depression is created during etching, where the centrally located pit in the etch-resist was located. Clearly this centrally located pit is positioned at a location on which the die attach pad 28 is later plated.

Figure 3E:
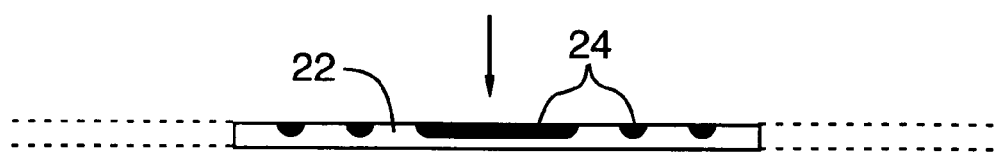

Metal contacts 24 are then deposited in the depressions in the first surface of the leadframe strip 22 to fill the depressions. The metal contacts 24 are solder contacts that are deposited by known solder paste printing technique, followed by reflow using known reflow techniques (FIG. 3E). This provides an array of solder filled depressions in the first surface of the leadframe strip 22, including a large solder filled depression circumscribed by smaller solder filled depressions. The metal contacts 24 later provide signal and power connections through the contact pads 26, through the wire bonds 32 and to corresponding pads of the semiconductor die 30 in the resulting leadless plastic chip carrier.

Figure 3F:
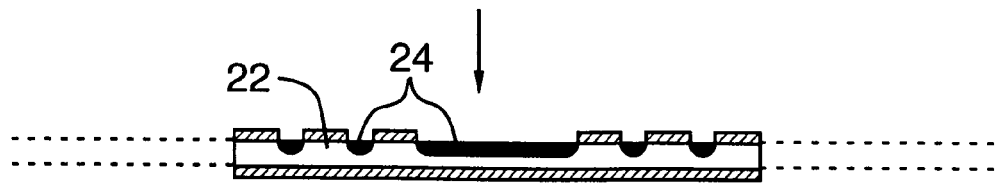

Referring to FIG. 3F, the leadframe strip 22 is coated with a layer of photo-imagable solder mask such as a photo-imagable epoxy. Both the upper and lower surfaces of the leadframe strip 22 are coated with the photo-imagable solder mask and the solder mask is imaged by exposure of the solder mask to ultraviolet light masked by a photo-tool and then developed. The solder mask is thereby patterned to provide pits in which the metal contacts 24 are exposed, including a larger central pit in which the large solder filled depression is exposed and the smaller pits circumscribing the larger central pit in which the smaller solder filled depressions are exposed. In the present embodiment, the leadframe strip 22 is not exposed.

Referring to FIG. 3G, layers of metals are deposited by plating in the pits in the solder mask, on the metal contacts 24, to form the plurality of contact pads 26 and the die attach pad 28 as shown. Again, different plating options are possible such as the exemplary plating options described in reference to FIG. 1G. It will be appreciated that the die attach pad 28 is plated on the large solder-filled depression in the present embodiment. After plating the layers of metal, the photo-imagable solder mask is stripped away.

Referring now to FIG. 3H, a singulated semiconductor die 30 is then conventionally mounted via epoxy (or other suitable means) to the die attach pad 28, and the epoxy is cured. Gold wire bonds 32 are then bonded between the semiconductor die 30 and the contact pads 26 and between the semiconductor die 30 and the die attach pad 28. The leadframe strip 22 is then molded in a suitable mold, using a molding material 34 and the molding material 34 is cured. As shown, the wire bonds 32 and the semiconductor die 30 are thereby encapsulated and the die attach pad 28 and the contact pads 26 are covered by the molding material 34.

The leadframe strip 22 is then subjected to an alkaline etch via full immersion etching to remove the remainder of the leadframe strip 22 and thereby expose the metal contacts 24 (FIG. 3I). Clearly the metal contacts 24 are located on the contact pads 26 in the form of a grid array. It will be appreciated that the metal contacts 24 that previously were in depressions in the surface of the leadframe strip now protrude from the lower surface of the molding material 34 shown in FIG. 3I, thereby providing contact standoff.

The individual packages are joined together by the molding material 34. Since the packages are electrically isolated prior to singulation, testing of the individual packages prior to singulation is possible. Singulation of the individual packages is then performed by, for example, saw singulation (FIG. 3J), An elevation view of the resulting LPCC 20 is shown in FIG. 4.

Specific embodiments of the present invention have been shown and described herein. However, modifications and variations to these embodiments are possible. For example, the leadframe strip in the above-described embodiment is a copper leadframe strip. However, other strip materials are possible, such as, iron-based alloys. Also, the etch resist can be applied by lamination rather than spin coating. While the above-described embodiments included exemplary metal deposition option, other options are possible.

Other modifications and variations may occur to those skilled in the art. All such modifications and variations are believed to be within the sphere and scope of the present invention.

We claim:

1. A process for fabricating a leadless plastic chip carrier, comprising:
    selectively etching a first surface of a single layer leadframe strip to thereby provide depressions in said first surface;
    depositing metal contacts in said depressions by applying a soldering paste on a bare surface of the single layer leadframe strip from which an etching material has been removed, the bare surface being said first surface of said leadframe strip having said depressions formed therein;
    selectively plating at least one layer of metal on at least said metal contacts to provide a plurality of selectively plated contact pads and a die attach pad;
    mounting a semiconductor die on said first surface of said die attach pad;
    wire bonding said semiconductor die to ones of the contact pads;
    encapsulating said wire bonds and the semiconductor die in a molding material such that said molding material covers the die attach pad and the contact pads;
    etching away said leadframe strip thereby exposing said metal contacts in the form of an array; and
    singulating said leadless plastic chip carrier from other leadless plastic chip carriers.

2. The process according to claim 1, wherein said selectively plating comprises selectively plating a plurality of layers of metal on at least said metal contacts.

3. The process according to claim 2, wherein said plurality of layers of metal includes successive layers of gold, nickel, copper, nickel and gold.

4. The process according to claim 2, wherein said plurality of layers of metal includes successive layers of nickel, palladium and gold.

5. The process according to claim 2, wherein said plurality of layers of metal includes successive layers of palladium and gold.

6. The process according to claim 2, wherein said plurality of layers of metal includes successive layers of palladium, nickel, palladium and gold.

7. The process according to claim 2, wherein said plurality of layers of metal includes successive layers of palladium, nickel and silver.

8. The process according to claim 2, wherein said plurality of layers of metal includes successive layers of copper, nickel and gold.

9. The process according to claim 1, wherein said selectively etching comprises selectively etching to provide a plurality of depressions for depositing a plurality of metal contacts on which said die attach pad is selectively plated.

10. The process according to claim 1, wherein said selectively etching comprises selectively etching to provide a large depression for depositing a large metal contact on which said die attach pad is selectively plated, said large depression being circumscribed by at least one row or smaller depressions.

11. The process according to claim 1, wherein said depositing metal contacts in said depressions comprises solder paste printing and reflowing to provide said metal contacts.

12. The process according to claim 1, wherein said selectively etching comprises:
   applying a layer of etch resist to said leadframe strip;
   patterning said etch resist to expose selected portions of the first surface of the leadframe strip; and
   etching said selected portions of said first surface of said leadframe strip.

13. The process according to claim 12, wherein said selectively etching further comprises:
   removing a remainder of said etch resist.

14. The process according to claim 1, wherein selectively plating comprises:
   depositing a plating mask on said first surface of said leadframe strip and said metal contacts;
   imaging and developing said mask to expose at least a surface of said metal contacts at removed portions of said mask;
   plating at least one metal layer on said surface of said metal contacts at the removed portions of said mask; and
   removing a remainder of said plating mask.

15. The process according to claim 14, wherein a portion of said leadframe strip is exposed during imaging and developing said mask, said die attach pad being plated up on said portion of said leadframe strip.

16. The process according to claim 1, further comprising wire bonding said semiconductor die to said die attach pad prior to encapsulating.

* * * * *